United States Patent [19]

Kurakata

[11] Patent Number: 4,643,952
[45] Date of Patent: Feb. 17, 1987

[54] COATING FILM BY ION PLATING
[75] Inventor: Ryo Kurakata, Saitama, Japan
[73] Assignee: Citizen Watch Co., Ltd., Tokyo, Japan
[21] Appl. No.: 781,500
[22] Filed: Sep. 30, 1985
[30] Foreign Application Priority Data Feb. 8, 1985 [JP] Japan ................................. 60-22831

[51] Int. Cl.$^4$ .............................................. B32B 9/00
[52] U.S. Cl. ............................... 428/472; 204/192 N; 427/38; 428/698
[58] Field of Search .................. 427/38; 428/472, 698; 204/192 N

[56] References Cited

U.S. PATENT DOCUMENTS 4,480,010 10/1984 Sasanuma et al. ................ 427/38 X Primary Examiner—Bernard D. Pianalto
Attorney, Agent, or Firm—Hopgood, Calimafde, Kalil, Blaustein & Judlowe

[57] ABSTRACT

A protective and decorative coating film of a beautiful black color which is composed of a mixture of titanium nitride and titanium carbide can be deposited on the surface of various metallic articles of personal ornament use such as watch cases by the techniques of ion plating in which the gaseous atmosphere of low pressure contains argon, nitrogen and an aliphatic hydrocarbon compound such as ethylene in a limited proportion. It is disclosed that the adhesion strength of the coating film to the substrate surface is largely influenced by the oxygen content in the coating film so that it is preferable to decrease the content of oxygen in the atmosphere to such an extent that the oxygen content in the thus formed coating film does not exceed 40% in the atomic ratio.

2 Claims, 2 Drawing Figures

COATING FILM BY ION PLATING

BACKGROUND OF THE INVENTION

The present invention relates to a method for forming a coating film by ion plating on a substrate surface or, more particularly, to a method for forming a decorative coating of blackish color tone by ion plating on the surface of a metallic substrate such as watch cases, watch straps, bracelets, rings and the like used for personal ornament.

As a trend in recent years, various goods for personal ornament use such as watch cases are required to be imparted with a color of specific hue and tone full of high-class sense instead of the traditional golden or silvery metallic luster. In accordance with such a strong demand, various methods have been developed and practiced for the surface finishing of a metallic substrate including the methods of colored plating, dyeing, coating and the like. These prior art methods are not quite satisfactory in one or more of disadvantages and defects that the desired high-class sense cannot be obtained, that the surface finished by the method has no sufficient durability due to the poor corrosion resistance and susceptibility to discoloration, peeling of the surface layer and scratches and the like mechanical damages, that the process of the method is complicated and troublesome and that the process uses or discharges some noxious chemicals and gase to cause serious problems in connection with the worker's health and environmental pollution.

SUMMARY OF THE INVENTION

It is therefore an object of the present invention to provide a method for forming a decorative super-hard coating film of a blackish color on the surface of a metallic substrate article for personal ornament use such as watch cases, watch straps, bracelets, rings and the like by the techniques of ion plating without the disadvantages and problems in prior art methods and products.

Another object of the invention is to provide a method for forming a coating film of a blackish color composed of titanium nitride and titanium carbide on a metallic substrate article.

Thus, the method of the present invention for forming a super-hard coating film composed of titanium nitride and titanium carbide on the surface of a metallic substrate article by the technique of ion plating comprises:

(a) holding the metallic substrate article to face an evaporation source of titanium metal in an atmosphere of a gaseous mixture comprising argon, nitrogen and an aliphatic hydrocarbon compound under a pressure in the range from $8 \times 10^{-4}$ to $5 \times 10^{-3}$ Torr;

(b) impressing a direct current voltage in the range from 20 to 200 volts between the evaporation source of titanium metal and the metallic substrate article; and (c) heating the titanium metal in the evaporation source to be evaporated in the form of metallic ions which deposit on the surface of the metallic substrate article as a mixture of titanium nitride and titanium carbide.

It has been discovered that the adhesive strength of the thus formed coating film to the substrate surface is heavily influenced by the oxygen content in the coating film so that the atomic ratio of oxygen to titanium in the coating film should desirably be 40% or smaller.

DETAILED DESCRIPTION OF THE PREFERRED EMBODIMENTS

Figure 1:
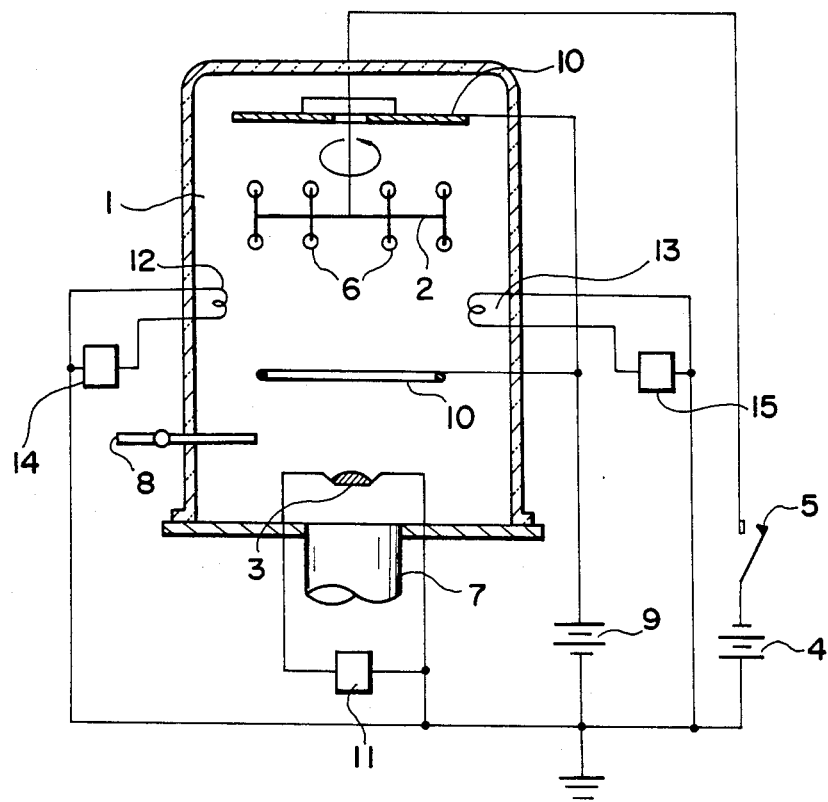
FIG. 1 is a schematic illustration of an apparatus used for the ion plating according to the invention together with a diagram of the external electric circuit.

As described above, the ion plating of the inventive method is carried out with titanium as the metal evaporated under impression of a direct current voltage in a reactive atmosphere comprising argon, nitrogen and an aliphatic hydrocarbon compound. When the reactive gas in the atmosphere is nitrogen alone, the coating film deposited by ion plating is composed of titanium nitride exhibiting a yellowish golden color with a deepness of the color varied depending on several parameters. When the atmosphere for the ion plating further contains an aliphatic hydrocarbon compound as another reactive gas, on the other hand, the coating film deposited by the ion plating is composed of a mixture of titanium nitride and titanium carbide exhibiting a blackish color.

The kind of the aliphatic hydrocarbon compound added to the atmosphere for ion plating is not particlarly limitative but it is usually selected from the group consisting of methane, acetylene, ethylene, propane and the like in view of the low cost and availability. These aliphatic hydrocarbon compounds may be used either singly or as a combination of two or more according to need. The blackishness of the coating film formed by the ion plating can be controlled by suitably selecting the kind of the aliphatic hydrocarbon compound and the partial pressure in the gaseous mixture of the atmosphere and, for example, a real deep black color of the coating film can be obtained by use of ethylene which is introduced into the atmosphere to give a 10 to 15% partial pressure based on the overall pressure while the atmosphere should be kept under a pressure in the range from $8 \times 10^{-4}$ to $5 \times 10^{-3}$ Torr in order that the ion plating is worked smoothly and efficiently.

In the following, the method of the present invention is described in more detail with reference to FIG. 1 of the accompanying drawing which schematically illustrates an apparatus used in the inventive method together with the diagram of the external electric circuit therefor.

The body of the apparatus is a vacuum chamber 1 in which a substrate holder 2 is installed, preferably, in a rotatable manner to face an evaporation source of titanium metal 3 below and the substrate holder 2 is connected to the cathode of a DC power source 4 of which the anode is grounded. After mounting a plural number of thoroughly cleaned substrate articles 6 on the substrate holder 2, the vacuum chamber 1 is evacuated through the vacuum duct 7 to produce a vacuum of a pressure of $2 \times 10^{-5}$ Toor or below. Thereafter, a small volume of argon gas is introduced into the vacuum chamber 1 through a gas inlet 8 and, when the pressure inside has reached $3 \times 10^{-3}$ Torr, the circuit of the DC power source 4 is closed by means of the switch 5 and thereby a voltage difference of 20 to 200 volts is impressed between the substrates 6 and the evaporation source of titanium metal 3, which is also grounded, to effect bombardment. Then, a gaseous mixture of nitrogen and an aliphatic hydrocarbon compound, e.g. ethylene, is introduced into the vacuum chamber 1 also through the gas inlet 8 to establish an overall pressure in the range from $8 \times 10^{-4}$ to $5 \times 10^{-3}$ Torr and the evaporation source of titanium metal 3 is energized by means of the power source 11 so that the titanium metal is heated and evaporated therefrom. The thus evaporated titanium atoms are ionized by the anodic electrodes 10 kept at a positive potential relative to the ground by means of the power source 9 and the titanium ions are accelerated by the electric filed between the evaporation source 3 as the anode and the substrate holder 2 or substrates 6 as the cathode to collide against the substrate surface where the titanium ions discharge and react with the nitrogen and carbon atoms in the atmosphere and are deposited in the form of titanium nitride and titanium carbide forming a coating film on the surface.

The ionization of the evaporated titanium atoms can be accelerated by the emission of thermoelectrons from the grounded thermoelectron filaments 12 and 13 heated by means of the heater power sources 14 and 15, respectively. The super-hard coating film formed according to the inventive method has a glossy black-based color tone and composed of a mixture of titanium nitride and titanium carbide as a result of the reaction of the titanium ions with the gaseous mixture of the atmosphere comprising nitrogen and the aliphatic hydrocarbon compound. Therefore, the substrate article for personal ornament use is imparted with a coating having excellent decorativeness and full of high-class sense.

The coating film formed by practicing the inventive method should preferably have a chemical composition composed of titanium, nitrogen and carbon in the ranges of 15 to 40%, 10 to 25% and 40 to 65%, respectively, in atomic percentages. In addition, the coating film unavoidably contains oxygen as mentioned below. The content of oxygen should be as low as possible but it is usually in the range from 2 to 40% in an atomic percentage based on titanium.

The coating film of the mixed titanium nitride and titanium carbide formed in the above described manner is very fashionable and of high value if it were not for the defect that the coating film may sometimes be peeled off to expose the bare substrate surface due to the poor adhesive strength of the coating film. Accordingly, the inventor has further continued extensive investigations to find the reason for the poor adhesion of the coating film and arrived at a discovery that the adhesive strength of the coating film is influenced by the oxygen contained therein or intervening between the coating layer and the substrate surface. A quantitative study for the phenomenon of peeling of the coating film by means of the Auger electron spectroscopy has led to a conclusion that the critical content of oxygen is 40% in the atomic ratio based on the titanium in the coating film and the adhesion strength of the coating film is substantially not affected when this atomic ratio does not exceed 40%.

The content of oxygen in the coating film should desirably be as low as possible but it is practically almost impossible to reduce the atomic ratio of oxygen to 2% or smaller as an unavoidable lower limit even when utmost care is undertaken as mentioned below.

A measure to be taken when minimization of the oxygen content in the coating film is desired is to shorten the length of time taken for mounting and demounting of the substrate articles in the vacuum chamber and the cooling time of the apparatus including the high-voltage electron gun as a matter of course. In addition, it is recommendable to utilize the getter action of titanium metal by covering the inner walls with titanium metal which is subjected to bake-out in vacuum.

The coating film formed according to the inventive method usually has a thickness in the range from 0.2 to 2 μm or, preferably, from 0.4 to 1 μm. When the thickness is smaller than the lower limit of the above range, the appearance of the coating film is no longer pure black and the coating film has a low mechanical strength with relatively poor adhesion to the substrate surface.

Figure 2:
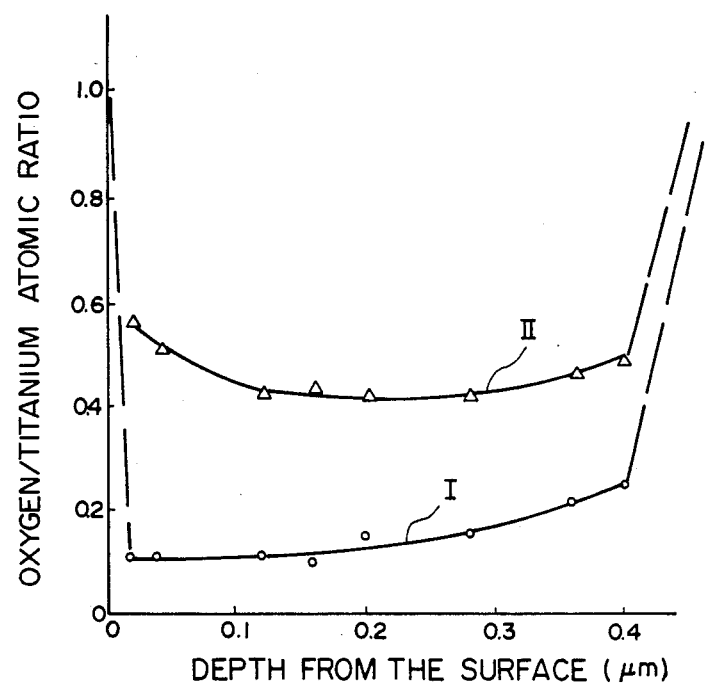
FIG. 2 is a graph showing the molar ratio of oxygen to titanium in the coating film formed according to the inventive method as a function of the thickness of the coating film.

FIG. 2 is a graph illustrating the relationship between the depth in μm from the surface of a black coating film of 0.4 μm thickness formed by ion plating on the surface of a leg portion of a stainless steel-made watch case as the abscissa and the oxygen/titanium atomic ratio in the coating film as the ordinate. Curve I is for a coating film formed according to the inventive method and Curve II is for a coating film according to a conventional method. In this figure, the depth 0 corresponds to the surface of the coating layer and the depth of about 0.4 μm corresponds to the interface between the coating film and the surface of the substrate. The increase of the atomic ratio in each of these extremities is due to the influence of the film surface and the substrate surface, respectively.

For example, stainless steel-made watch straps provided with a black coating film by ion plating were heated at 250° C. and then quenched to test the adhesion strength of the coating film. The results were that no peeling of the coating film took place at all when 20 watch straps were coated according to the inventive method and subjected to the above mentioned quenching test while peeling of the coating film was noted in 7 of 20 watch straps provided with a coating film according to a conventional method.

In the following, the method of the present invention is illustrated by way of examples for watch cases although the inventive method is applicable to any other metal-made articles.

EXAMPLE 1

Watch cases made of SUS 316 stainless steel as the substrates were mounted on the substrate holder 2 of the apparatus illustrated in FIG. 1 and, after evacuation to a pressure of $3 \times 10^{-5}$ Torr, argon gas was introduced into the vacuum chamber 1 to give a gaseous pressure of $3 \times 10^{-3}$ Torr. Then, a voltage of 80 volts was impressed to the substrate holder 2 from the power source 4 and the surface of the substrates was cleaned by bombardment at 100° C. for 10 minutes.

Thereafter, the argon gas was admixed with nitrogen and ethylene to keep the inside pressure at $8 \times 10^{-4}$ Torr and the titanium metal in the evaporation source was heated and evaporated by means of the power source 11 for evaporation while a direct current voltate of 50 volts was impressed between the substrate holder 2 and the evaporation source 3 to perform ion plating at 100° C. for 25 minutes. The watch cases were provided with a glossy coating film of beautiful black color on the surface.

The thus obtained coating film on the watch case was highly resistant against simulated perspiration even after 48 hours of dipping test and gave excellent results in the abrasion test. No peeling of the coating film was noted in the above described quenching test after heating at 250° C.

EXAMPLE 2

Nickel-plated watch cases made of a BS alloy were used as the substrates and the surface thereof was cleaned by bombardment in the same manner as in Example 1.

Thereafter, the argon gas was admixed with nitrogen and methane to keep the inside pressure at $5 \times 10^{-3}$ Torr and the titanium metal in the evaporation source was heated and evaporated by means of the power source for evaporation while a direct current voltge of 100 volts was impressed between the substrate holder and the evaporation source to perform ion plating at 100° C. for 20 minutes. The thus formed coating film on the watch case had a beautiful color of purplish black. Quite satisfactory results were obtained in each of the anticorrosion test with a simulated perspiration, quenching test from 250° C. and abrasion test undertaken in the same manner as in Example 1.

What is claimed is:

1. A metal-made article coated with a coating film composed of titanium nitride and titanium carbide in such a proportion that the atomc ratios of titanium, nitrogen and carbon are in the ranges of from 15 to 40%, from 10 to 25% and from 40 to 65%, respectively, and wherein the coating film contains oxygen in an atomic ratio of oxygen to titanium not exceeding 40%; the coating film being formed by a method of ion plating comprising the steps of: (a) holding the metallic substrate article to face an evaporation source of titanium metal in an atmosphere of a gaseous mixture comprising argon, nitrogen and an aliphatic hydrocarbon compound under a pressure in the range from $8 \times 10^{-4}$ to $5 \times 10^{-3}$ Torr; (b) impressing a direct current voltage in the range from 20 to 200 volts between the evaporation source of titanium metal and the metallic substrate article; and (c) heating the titanium metal in the evaporation source to be evaported in the form of metallic ions which deposit on the surface of the metallic substrate article as a mixture of titanium nitride and titanium carbide.

2. The metal-made article coated with a coating film composed of titanium nitride and titanium carbide as claimed in claim 1 wherein the coating film contains oxygen in an atomic ratio of oxygen to titanium from about 2 to about 40%.

* * * * *